United States Patent [19]

Kumar

[11] Patent Number: 4,609,889
[45] Date of Patent: Sep. 2, 1986

[54] MICROWAVE FREQUENCY POWER COMBINER

[75] Inventor: Mahesh Kumar, S. Brunswick Township, Middlesex County, N.J.

[73] Assignee: RCA Corporation, Princeton, N.J.

[21] Appl. No.: 630,839

[22] Filed: Jul. 13, 1984

[51] Int. Cl.⁴ .......................................... H03H 11/36
[52] U.S. Cl. .................................. 333/100; 307/304; 333/128; 357/22
[58] Field of Search ............... 333/124, 125, 128, 136, 333/100; 307/304; 357/23.1, 41, 22 G, 22 P, 22 S

[56] References Cited

U.S. PATENT DOCUMENTS

| | | | |
|---|---|---|---|
| 3,135,926 | 6/1964 | Bockemuehl | 307/304 X |
| 3,191,061 | 6/1965 | Weimer | 357/41 X |
| 3,714,523 | 1/1973 | Bate | 307/304 X |
| 3,872,491 | 3/1975 | Hanson et al. | |
| 3,926,694 | 12/1975 | Cauge et al. | 357/41 X |
| 4,015,278 | 3/1977 | Fukuta | 357/22 |
| 4,254,430 | 3/1981 | Beneking | 357/22 |
| 4,308,473 | 12/1981 | Carnes | |
| 4,315,272 | 2/1982 | Vorhaus | |
| 4,372,032 | 2/1983 | Collins et al. | |
| 4,380,022 | 4/1983 | Yoder | 357/22 |
| 4,399,439 | 8/1983 | Upadhyayula | 330/124 R |
| 4,472,691 | 9/1984 | Kumar et al. | 333/136 X |
| 4,511,813 | 4/1985 | Pan | 333/128 X |

*Primary Examiner*—Paul Gensler
*Attorney, Agent, or Firm*—Joseph S. Tripoli; Robert L. Troike; Raymond E. Smiley

[57] ABSTRACT

An in-phase power combiner is constructed of a double field-effect transistor having a common drain, first and second gates and first and second sources. The gates are adapted to receive radio frequency signals of powers P1 and P2, where P1=P2, to be power combined. The combined power output signal P equal to at least P1+P2 appears at the drain. An alternative power combiner for producing power combination of two unequal power input signals is constructed of a double dual gate FET having, in addition to the above-mentioned elements, third and fourth gates.

1 Claim, 4 Drawing Figures

MICROWAVE FREQUENCY POWER COMBINER

CROSS REFERENCE TO RELATED APPLICATION

U.S. patent application Ser. No. 630,840 filed July 13, 1984 discloses a power divider circuit.

The present invention relates to a microwave frequency power combiner and more particularly to such a combiner which exhibits no power loss in signal passage through the combiner and may provide signal gain.

BACKGROUND OF THE INVENTION

Many applications involve circuits requiring two input power signals to be combined into one output signal to be operated on by following circuits. Known prior art circuits for accomplishing power combination are passive, that is not including active devices. Such circuits exact a penalty in that the output power is less than the sum of the total input power by, for example five to ten percent, the loss increasing with increasing frequency. This loss is compensated by preamplifier or post amplifier circuits increasing circuit complexity. Furthermore, where greater than two-way power combination is required, it is common to cascade two or more power combiners to accomplish the task with consequent increase in power loss. In some applications it is desirable to have unequal power in the two or more input power signals and still have a correctly phased combined power output signal. Thus, by way of example, for input power P1 and P2 bearing a 2-to-1 relationship an output power of P=P1+P2 results. In such circuits, as with equal power combination circuits, a loss is incurred in passing through the power combiner.

SUMMARY OF THE INVENTION

In accordance with a preferred embodiment of the invention a microwave frequency power combiner comprises a double field-effect transistor comprising a common drain electrode, first and second gate electrodes, and first and second source electrodes, said first and second gate electrodes adapted to receive signals of powers P1 and P2, respectively, to be combined in power, said drain electrode being adapted to provide output power P, said FET being adapted to receive gate-source bias and drain-source bias in values such that P is at least equal

DETAILED DESCRIPTION

Figure 1:
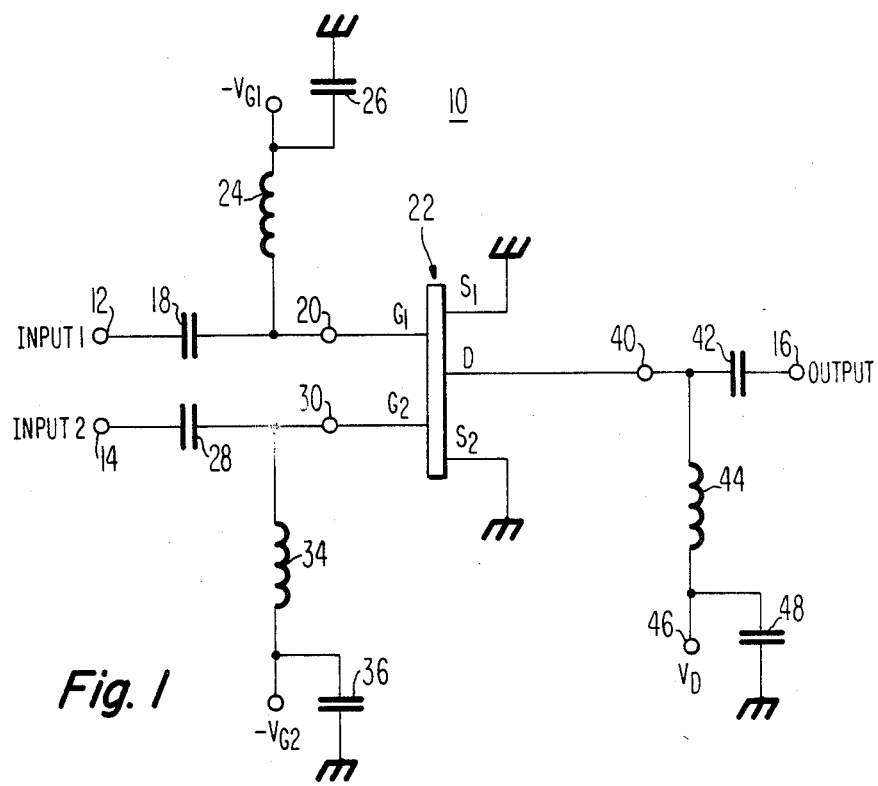
FIG. 1 is a double FET illustrated in electrical schematic form and adapted for power combining two input signals of equal power into an output signal which is approximately equal to or greater than the total power of the input signals.

With reference to FIG. 1, 1, FET (field effect transistor) inphase power combiner circuit 10 includes circuit input terminals 12 and 14 and a circuit output terminal 16. In response to input powers of P1 and P2 at input terminals 12 and 14 respectfully, where P1 is equal to P2, an output power P equal to or more than P1+P2 is presented at terminal 16. Input terminal 12 is series connected with a radio frequency (RF) coupling capacitor 18 to first gate terminal 20 of a double FET 22. The nature of double FET 22 will be explained hereinafter. Capacitor 18 is also series connected with an RF choke 24 to the parallel combination of a terminal receptive of gate bias voltage $-V_{G1}$ and a grounded RF bypass capacitor 26. Similarly, input terminal 14 is series connected with an RF coupling capacitor 28 to gate terminal 30 of double FET 22. Capacitor 28 is also series connected with an RF choke 34 to the parallel combination of a terminal receptive of gate bias $-V_{G2}$ and to a grounded RF bypass capacitor 36. FET 22 has two sources denoted S1 and S2 each of which is circuit grounded. FET 22 has a single drain terminating at a drain terminal 40. Drain terminal 40 is connected through an RF coupling capacitor 42 to circuit output terminal 16. Capacitor 42 is also series connected to an RF choke 44 to the parallel combination of a terminal 46 receptive of drain bias $V_D$ and to a grounded RF bypass capacitor 48.

Figure 2:
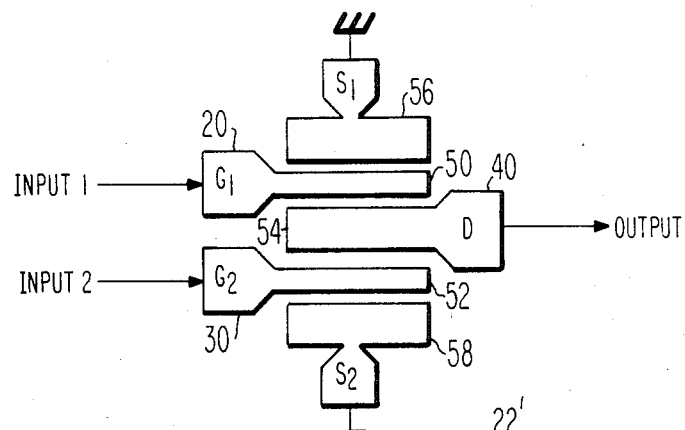
FIG. 2 is an FET chip which is useful in constructing, in monolithic form, the FET circuit illustrated in FIG. 1.

Attention is now directed to FIG. 2 which illustrates the physical arrangement of an exemplary FET transistor 22 chip. Therein a gate electrode 50 is connected to first gate terminal 20. Gate electrode 52 is connected to second gate terminal 30. Gate electrodes 50 and 52 are of the same length and width. Sources S1 and S2 are circuit grounded and are connected respectively to source electrodes 56 and 58. Source electrodes 56 and 58 are of the same length and width. Common drain electrode 54 is connected to drain terminal 40. That is, transistor 22 can be thought of as two single-gate FETs sharing a common drain. FET chip 22' is suitable for realization as a monolithic circuit. In practice, not only the FET but also the capacitors and chokes illustrated in FIG. 1 can be fabricated on a substrate of gallium arsenide material.

In operation, radio frequency input signals of equal power levels are applied to terminals 12 and 14 of power combiner circuit 10. The FET 22 serves to perform in phase combination of the two signals producing a signal having substantially the total power of the two input signals at output terminal 16 because gate electrodes 56 and 58 (FIG. 2) are of the same length and width. Because of the amplifying nature of FET 22, it is possible through a proper selection of gate and drain bias values to effect amplification as well as power combination in circuit 10. Thus, for example, with gate source ($G_1$) bias of −1 volt, gate source $G_2$ bias of −1 volt and drain source bias of 4 volts, 5 decibels of overall power gain may be expected.

Figure 3:
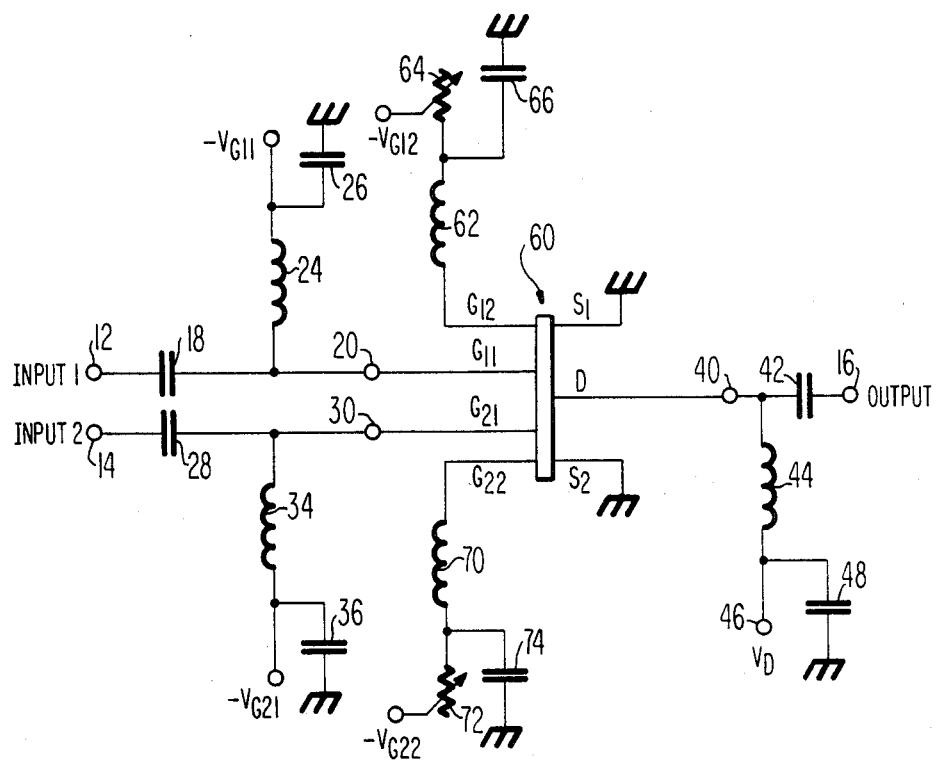
FIG. 3 is a dual-gate double FET illustrated in electrical schematic form and adapted for power combining two input signals which may be of unequal power into an output signal wherein the output power is approximately equal to or greater than the total input power.

In some circuit applications the input power levels are not identical. In such a case the circuit of FIG. 3 is applicable. Many of the components in FIG. 3 are identical to those in FIG. 2 and where so are identically numbered.

FET 60 which is at the heart of the circuit in FIG. 3 is similar to FET 22 in FIG. 1 except that it has two additional gates. FET 60 can be described as a common drain dual-gate double FET. Therefore, gate terminal 20 of FET 60 is connected to gate $G_{11}$, gate terminal 30 of FET 60 is connected to gate $G_{21}$, these corresponding to the sole gates in the circuit of FIG. 1. Additional control gate $G_{12}$ is series connected with an RF choke 62 to the parallel combination of a variable resistor 64 and a grounded RF bypass capacitor 66. Variable resistor 64 is connected to an additional source of gate bias $-V_{G12}$ and is intended to illustrate that the source of bias power supplied to gate $G_{12}$ is adjustable in nature. Similarly, second gate $G_{22}$ is series connected with choke 70 and the parallel combination of variable resistor 72 and bypass capacitor 74. Variable resistor 72 is connected to a gate-source power supply $-V_{G22}$. Again as with resistor 64 variable resistor 72 is intended to illustrate the fact that adjustable power source may be supplied to gate $G_{22}$.

Figure 4:
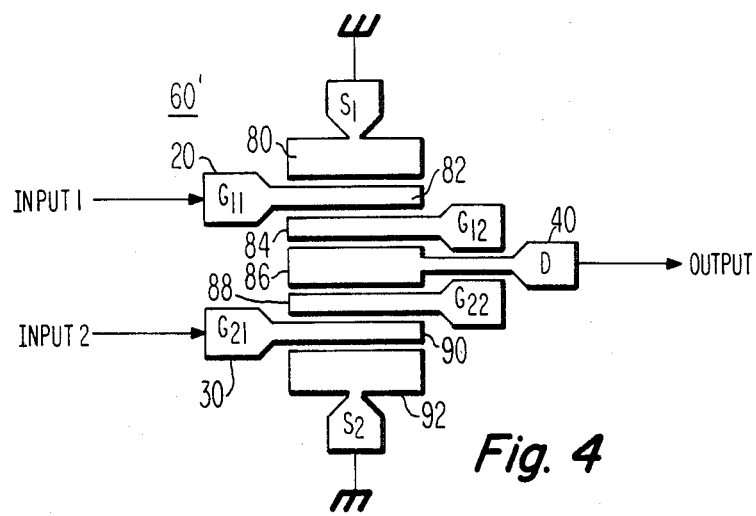
FIG. 4 is an FET chip which is useful in constructing, in monolithic form, the FET circuit illustrated in FIG. 3.

The physical arrangement of transistor 60 for realization on a monolithic circuit is as illustrated in FIG. 4. Therein FET transistor chip 60' comprises source electrodes 80 and 92, gate electrodes 82, 84, 88 and 90 and drain electrode 86. Source electrode 80 is connected to grounded source pad $S_1$ and first transistor first gate electrode 82 is connected to gate pad $G_{11}$ also legended 20. Gate electrode 84 is connected to gate pad $G_{12}$. Common drain electrode 86 is connected to drain pad 40. Gate electrode 88 is connected to gate pad $G_{22}$. Gate electrode 90 is connected to gate pad $G_{21}$ also legended 30 and source electrode 92 is connected to grounded source pad $S_2$. It will be realized by a review of FIG. 4 that chip 60' essentially comprises two dual gate FETs sharing a common drain electrode 86 and drain pad 40. As with the transistor of FIG. 2, transistor chip 60' can be configured on the gallium arsenide substrate which also contains various other chokes and capacitors illustrated in FIG. 3.

Operation of the circuit of FIG. 3 is as follows. RF signals having power P1 and P2 are connected to input terminals 12 and 14. Voltage is adjusted on gates $G_{12}$ and $G_{22}$ corresponding to the relative ratios of power connected to the two input terminals 12 and 14. The bias voltage values at $G_{12}$ and $G_{22}$ depend on the input power levels at terminals 12 and 14. Both FETs have gain, for example 10 dB. If P1 is larger than P2, for example, then $V_{G12}$ is more negative than $V_{G22}$ and the voltages are set such that the power levels at the drain terminal due to the respective input signals are identical after amplification. The proper combination of $V_{G12}$ and $V_{G22}$ can also provide the power combination with desired gain or variable gain. For example, if P1 and P2 are the input power levels, the output is A·(P1+P2) where A is the amplification factor. The magnitude of A can be varied by proper choice of $V_{G12}$ and $V_{G22}$.

What is claimed is:

1. A radio frequency signal power combiner comprising; in combination:

a double field-effect transistor (FET) comprising a common drain, first and second source electrodes, and first, second, third and fourth gate electrodes; said first and second gate electrodes for receiving signals of powers P1 and P2 respectively to be combined in power, said drain electrode being responsive to said input powers for generating output power P, said FET having means for receiving gate-source bias and drain-source bias of values such that, when said gate-source bias and drain-source bias are present P is at least equal to P1 plus P2;

means providing adjustable gate-source bias to said third and fourth gate electrodes for determining, by the amount of gate-source bias applied to each electrode, the fraction that P1 is to P and that P2 is to P, said first gate and third gate electrodes being positioned between said common drain and first source, said second gate electrode and fourth gate electrode being positioned between said common drain and said second source, said third and fourth gate electrodes being relatively nearer to said common drain, said first and second gate electrodes being relatively nearer to said first source and second source electrodes, respectively; and a gallium arsenide substrate, said electrodes being on one side of said gallium arsenide substrate.

* * * * *